United States Patent [19]

Ketterling

[11] Patent Number: 5,467,373
[45] Date of Patent: Nov. 14, 1995

[54] DIGITAL FREQUENCY AND PHASE MODULATOR FOR RADIO TRANSMISSION

[75] Inventor: Hans-Peter Ketterling, Berlin, Germany

[73] Assignee: Robert Bosch GmbH, Stuttgart, Germany

[21] Appl. No.: 5,890

[22] Filed: Jan. 15, 1993

[30] Foreign Application Priority Data

Jan. 15, 1992 [DE] Germany .................... 42 00 816.6

[51] Int. Cl.$^6$ .................................................. H03D 3/24
[52] U.S. Cl. ........................ 375/327; 331/18; 455/112; 332/128
[58] Field of Search .................. 375/81, 120; 331/18, 331/19, 25, 1 A, 16; 455/183.1, 260, 264, 112, 113, 119; 332/128

[56] References Cited

U.S. PATENT DOCUMENTS

| | | | |
|---|---|---|---|
| 3,413,565 | 11/1968 | Babany et al. | 331/18 |
| 3,516,007 | 6/1970 | Bos et al. | 331/18 |
| 4,052,672 | 10/1977 | Enderby et al. | 455/112 |
| 4,271,531 | 6/1981 | Torii et al. | 331/18 |
| 4,654,859 | 3/1987 | Kung et al. | 331/18 |
| 4,682,124 | 7/1987 | Schutz | 455/113 |
| 4,736,167 | 4/1988 | Kojma et al. | 331/18 |
| 4,739,288 | 4/1988 | Ide et al. | 455/112 |
| 5,021,754 | 6/1991 | Shepherd et al. | 332/128 |
| 5,113,152 | 5/1992 | Norimatsu | 331/11 |
| 5,194,829 | 3/1993 | Schoffel | 455/260 |

FOREIGN PATENT DOCUMENTS

| | | |
|---|---|---|
| 0408238A2 | 1/1991 | European Pat. Off. . |
| 0408238A3 | 1/1991 | European Pat. Off. . |
| 2012506 | 7/1979 | United Kingdom . |

OTHER PUBLICATIONS

Von Stefan Drude, "Kompakter Chipsatz für preiswerte Funktelefone", (1990), pp. 60–65, Funkschau, vol. 62, No. 5, Munchen, DE.

Primary Examiner—Stephen Chin
Assistant Examiner—T. Ghebretinsae
Attorney, Agent, or Firm—Frishauf, Holtz, Goodman, Langer & Chick

[57] ABSTRACT

For digital transitions from one binary logic level to another by frequency or phase shift of an electric carrier wave the modulation sidebands are reduced by performing each transition by means of several phase steps at small intervals. Equal phase steps at varying intervals are preferred over equal intervals between varying phase steps although both procedures can provide a low-bandwidth transition. This procedure is readily incorporated at low cost in frequency synthesizers. The use of a higher-frequency master oscillator (16) followed by a fixed-ratio frequency divider (17) ahead of a variable-ratio frequency divider (18) makes it easy to shift phase or frequency digitally by small quick steps. Another variable-ratio frequency divider (13) is desirable but not essential in the final PLL between a ultimately controlled oscillator (10) and a loop filter (12) connected to a phase discriminator (11). The discriminator (11) and the two variable-ratio frequency dividers (17, 13) require simultaneous or coordinated initialization (line 20). A binary digital signal produces GMSK modulation by means of a processor in which the divider ratios and their timings and sequence are stored. The steps are small enough for the loop filter to provide adequate bandwidth reduction. Steps each produced by a divisor one unit higher than the divisor which keeps the phase constant for the nominal frequency are produced by one cycle of the reference frequency, which corresponds to a number equal to the overall divisor of cycles of the master oscillator.

17 Claims, 4 Drawing Sheets

DIGITAL FREQUENCY AND PHASE MODULATOR FOR RADIO TRANSMISSION

This invention concerns radio transmission of frequency or phase modulated digital signals, particularly directed to land mobile receivers.

Announcements or news information which are present in the baseband of a transmission cannot be directly transmitted by frequency or phase modulation in most cases for various reasons. A radio frequency signal is often used, therefore, as a carrier that is modulated with announcements or news. Frequency modulators and phase modulators are collectively referred to as angle modulators.

Among the known angular modulators those that operate at constant amplitude or envelope curve of the modulated signal are particularly well suited for inclusion in land mobile radio communication. In such a case it is possible to use Class C power amplifiers in the transmitters and to use limiting amplifiers in the receivers, both of which favor economy in operation. For the implementation of digital frequency and phase modulators various possibilities are known, of which a few are simpler than others or have properties more favorable than others.

The same means can be utilized in part for modulation and demodulation, phase and frequency regulation loops being a good example of that economy. It is noted that such modulators in many cases can be incorporated in the frequency synthesizer components.

Figure 2:
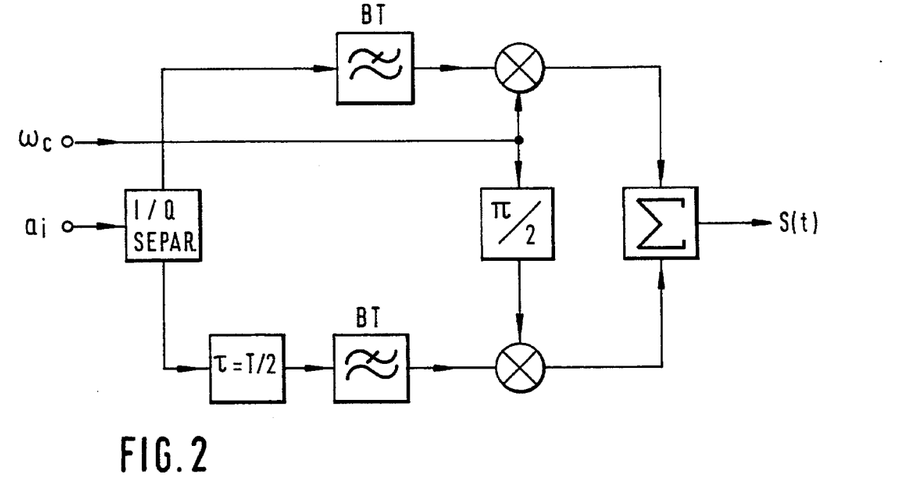
FIG. 2 is a circuit block diagram of a known generator of four phase modulation (QPSK) and offset-QPSK (OQPSK), mentioned above.

The simplest case of a digital frequency and phase modulator is the case of a binary digital phase modulator which in principle can be implemented by a simple polarity reverser, but in such a case a broad band switching spectrum is produced. If it is desired to obtain controlled phase transitions that are smooth, in order to reduce the modulation bandwidth, the baseband signal must first be correspondingly shaped either by filtering or by use of a reference table and digital-to-analog conversion, after which the resulting signal is multiplied by the carrier frequency. If the baseband occupies the value region between −1 and +1, the modulated carrier is obtained directly after the multiplication. Instead of a true multiplier it is also possible to utilize a ring mixer or modulator, in which case the harmonics must be filtered out in a following stage. In the case of four phase modulation (QPSK) and offset-QPSK (OQPSK) the known circuit of FIG. 2 is much used, in which the resulting signal is obtained by adding together two orthogonal individual signals. The conditions for smooth transitions correspond to those of the previously mentioned binary case. GMSK modulation can, moreover, be regarded as offset-QPSK with a defined BT product: in other words, after baseband filtering with a suitable BT product a QPSK modulator can be used if there is also generated the necessary offset between the I and Q components of the modulation signal. In this way there result precisely controlled phase shifts and the necessary modulation index h=0.5 can be maintained with high precision.

The output signal,of such modulators can be represented by the following equations:

$$s(t) = \sqrt{\frac{2E_B}{T}} \cdot \cos[\omega_c t + \phi(t)]$$

$$\phi(t) = \sum_{1}^{1,n} a_i \cdot \pi h \cdot \int_0^T g(t)dt$$

In the above expressions s(t) is the time function, $E_B$ is the energy per bit, T is the bit length, then $\phi(t)$ is the momentary phase, h is the modulation index and a is the value of the i-th bit (±), while g(t) describes the time course of the phase.

In case the highest modulation frequency exceeds the cut-off frequency of the loop filter, the summing circuit is used for modulation. Otherwise the modulation can be performed by the VCXO. Both cases refer to the state of the art and may be used additionally to the invention described here. When the modulation process is based on alterations of the mentioned stepwise adjustable dividers.

SUMMARY OF THE INVENTION

It is an object of the present invention to provide a simple and economic digital frequency or phase modulator with the possibility of sharing the use of circuit components which are needed anyway for frequency generation.

Briefly, the output of a highly accurate voltage-controlled oscillator, preferably a voltage-controlled crystal oscillator (VCXO), is connected to the input of a fixed frequency divider. The output of that frequency divider is connected to the input of a stepwise adjustable frequency divider which can be initialized together with a discriminator and a second stepwise adjustable divider. The first adjustable frequency divider is connected with a first input of the discriminator, of which the second input is connected through a second adjustable frequency divider with the output of a voltage control oscillator (VCO) and the output of the discriminator, after passing through a loop filter, is connected directly or through a summing circuit which can receive at another input a modulating voltage of a certain frequency range, to a control input of the VCO, the output of which provides the desired modulated signal. Other modulating signals are provided to control one of the variable-ratio frequency dividers, preferably the one connected to the fixed ratio frequency divider. In that case, the modulating signal is controlled with reference to stored tables of divisor value changes and their sequence timing.

BRIEF DESCRIPTION OF THE DRAWINGS

The invention is further described, by way of illustrative example, with reference to the annexed drawings, in which.

DESCRIPTION OF THE ILLUSTRATED EMBODIMENTS

Figure 1A:
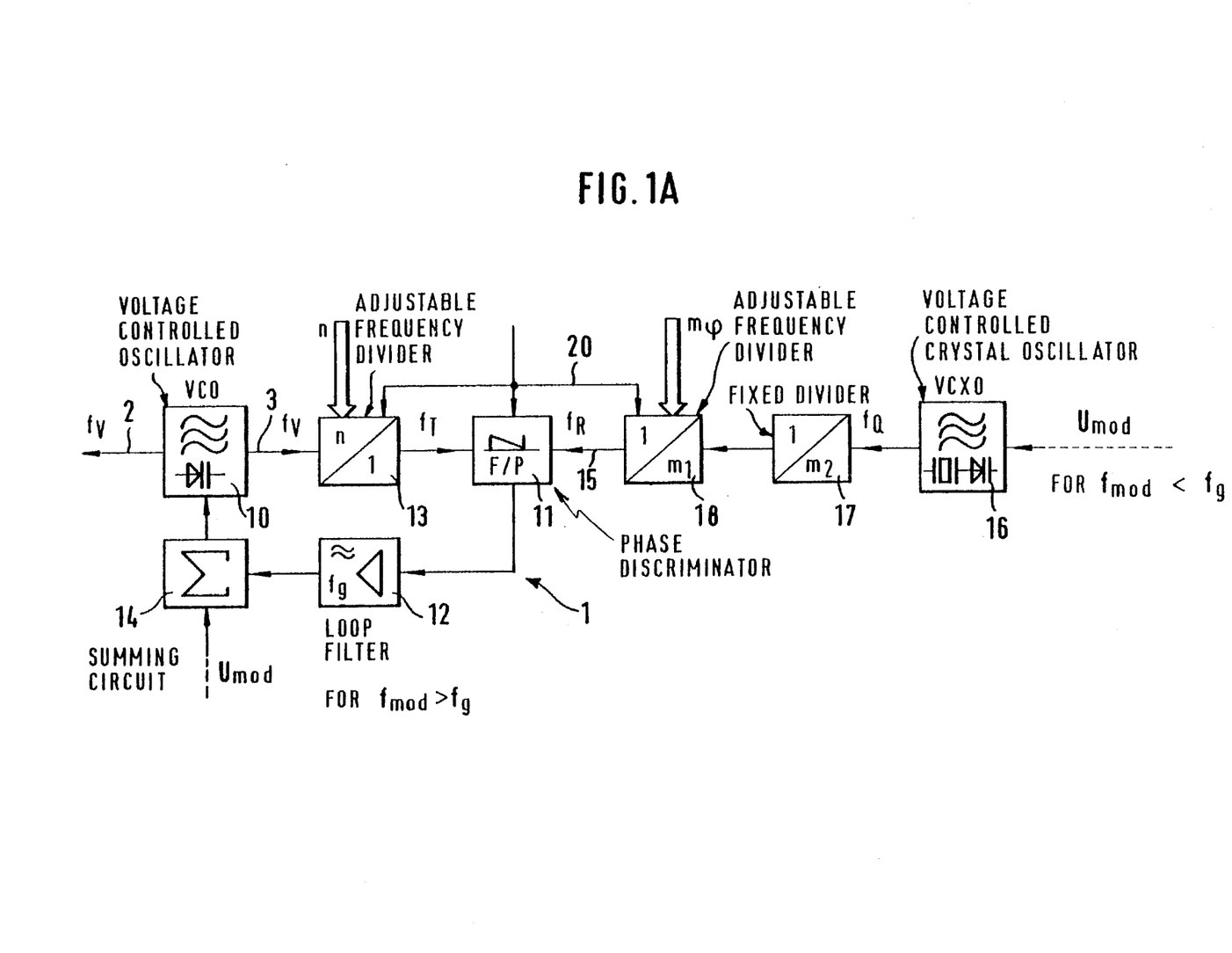
FIG. 1A is a circuit block diagram of a PLL frequency preparation (synthesizer) for a radio transmitter in land mobile broadcasting or communication service, slightly modified and supplemented for frequency or phase modulation in accordance with the invention.

The circuit of FIG. 1A is usable both for analog FM and for digital FM. Analog phase modulation can be implemented by differentiating the low frequency or baseband signal before modulation, thus in practice passing it through a low frequency modulation amplifier with a frequency characteristic rising at 6dB per octave. In accordance with the invention this phase-locked loop (PLL) circuit is suitable also for digital phase modulation. If the PLL is in the stationary condition, the following apply:

$$f_R = \frac{f_Q}{m_1 \cdot m_2} = \frac{f_V}{n} \quad (1)$$

$$\phi_R = \frac{\phi_Q}{m_1 m_2} = \frac{\phi_V}{n} \quad (2)$$

The reference frequency of such circuits is normally 10 kHz in land mobile radio equipment (e.g. because of the half raster shift in a 20 kHz channel spacing pattern) or 12.5 or 25 kHz in order to provide the prevailing channel raster of 10, 12.5 and 25 kHz, and has a value of 200 kHz in the GSM System. The limiting frequency of the loop is of the order of magnitude of 1% of the reference frequency or less, since otherwise no sufficient suppression is possible of the sidebands of the generated frequency arising from the reference frequency. Limiting frequencies of less than 100 Hz thereby result for normal mobile radio apparatus and less than 2 kHz for GSM mobile telephones.

The simplest possibility for modulation, following the loop filter, is addition of the modulating signal voltage to the control voltage produced in the loop as shown in FIG. 1A by the summing device. In this case all modulation components above the loop limiting frequency are directly effective, whereas below that limiting frequency a feedback is produced, which is to say this method does not permit the introduction of modulation frequencies that are equal to or less than the limit frequency of the loop. It is advantageous, however, for the normal PLL synthesizer to be extended by simpler means, so that it is usable for generating analog frequency modulation. It is disadvantageous in this method that the peak deviation must be carefully set, but in principle that is not exactly defined and cannot be precisely kept constant, for as a result of the nonlinear VCO characteristic, the peak deviation is dependent upon the momentary VCO frequency, not to mention drifts resulting from temperature or other causes of deviation.

When a PLL frequency synthesizer is used, the frequency of which is mixed with another frequency, e.g. in order to provide the necessary offset between receiver local oscillator frequency and transmitter frequency, or because the simple insertion of the modulating frequency into the loop is not practical (e.g. in synthesizers for duplex equipment), the reference frequency often lies in the region of several MHz. In that case, however, a loop limit frequency can be provided which lies above the upper boundary of the baseband. In this case, which also permits particularly easy mitigation of microphonic effects and the like, demodulation above the corresponding by reference frequency can quite elegantly be introduced into the regulation loop and is then directly applied to the VCO frequency. If the loop interposes some frequency division, then a decrease or increase of the deviation and $\Delta F$ can be produced, as is also evident from equation (1) and FIG. 1 as follows:

$$\Delta F_v = n/m \cdot \Delta F_Q \text{ with } m = m_1 \cdot m_2 \quad (3)$$

Since it is important to maintain the mostly strict accuracy requirements for the generated frequency, the modulator reference oscillator is normally to be implemented by provision of a highly precise VCXO. If it is of interest to provide a controlled and precisely defined analog or digital FM or PM, this can be done directly through the PLL on the VCO, optionally, as shown in equation (3), with multiplication by the frequency divider ratio.

Since every VCO frequency change directly follows every VCXO frequency change, this applies also for the phase or frequency transitions, insofar as their rapidity remains below the predetermined boundary of the loop limit frequency. For this purpose, however, any varieties of filters are not usable within the loop, because only certain filter types are permissible because of the stability requirements of the phase-locked loop (PLL).

Control loops of this kind can also be used for demodulation of the intermediate frequency in the receiver, if a VCO is coupled by means of a PLL to the intermediate frequency. The frequency and phase information of the intermediate signal are then carried over onto the control voltage of the demodulation PLL and can then be separated therefrom as a baseband signal. An astute choice of the loop limit frequency makes it possible, among other things, to optimize the signals to the noise ratio of the demodulation.

The circuit block diagram of FIG. 1A shows a fully versatile digital phase or frequency modulator built into a frequency synthesizer for a communication transmitter. The output of the synthesizer is a voltage controlled oscillator 10 which is controlled by a phase-locked loop (PLL) designated by the reference numeral 1. The VCO 10 provides its useful output for the communication equipment at 2 and has a feedback connection 3 for the phase-locked loop. The principal other elements of the phase-locked loop are the phase discriminator 11 and the loop filter 12, but a frequency divider 13 is interposed between the VCO 10 and the discriminator 11 which has a variable digital divisor. Between the loop filter 12 and the control input of the VCO 10 is a summing circuit 14 for insertion of digital modulation with a frequency which is greater than the maximum variation frequency of the loop.

A reference frequency is provided through the connection 15 to the discriminator 11. The first step for generating the reference frequency is performed by a highly stable, voltage controllable crystal oscillator 16. This is a highly stable oscillator which is nevertheless subject to modulation, as is well known. Its modulation input shown at the right in FIG. 1 is suitable for modulation at frequencies which are less than the proper limit of frequency of variation of the loop. The output of the VCO 16 is divided, for convenience of component availability, in a fixed ratio digital frequency divider 17 which divides the frequency of the VCO by an integer referred to herein as $m_2$ and a variable frequency divider 18. The frequency dividers 17 and 18 thus are cascaded, as clearly seen in FIG. 1A by the arrow-connections between oscillator 16, fixed divider 17 and adjustable divider 18. The output of the frequency divider 17 is coupled to the input of a variable ratio frequency divider 18, which divides its input frequency by the integer $m_1$ to produce the reference frequency supplied to the discriminator 11. This digital frequency divider 18 is, as further described below, subject to changes in its division ratio stepwise by precisely timed intervals to produce phase or frequency modulation. It may be necessary for the VCXO to operate at a considerably high multiple of the reference frequency supplied through the connection 15 to the discriminator.

Figure 1B:
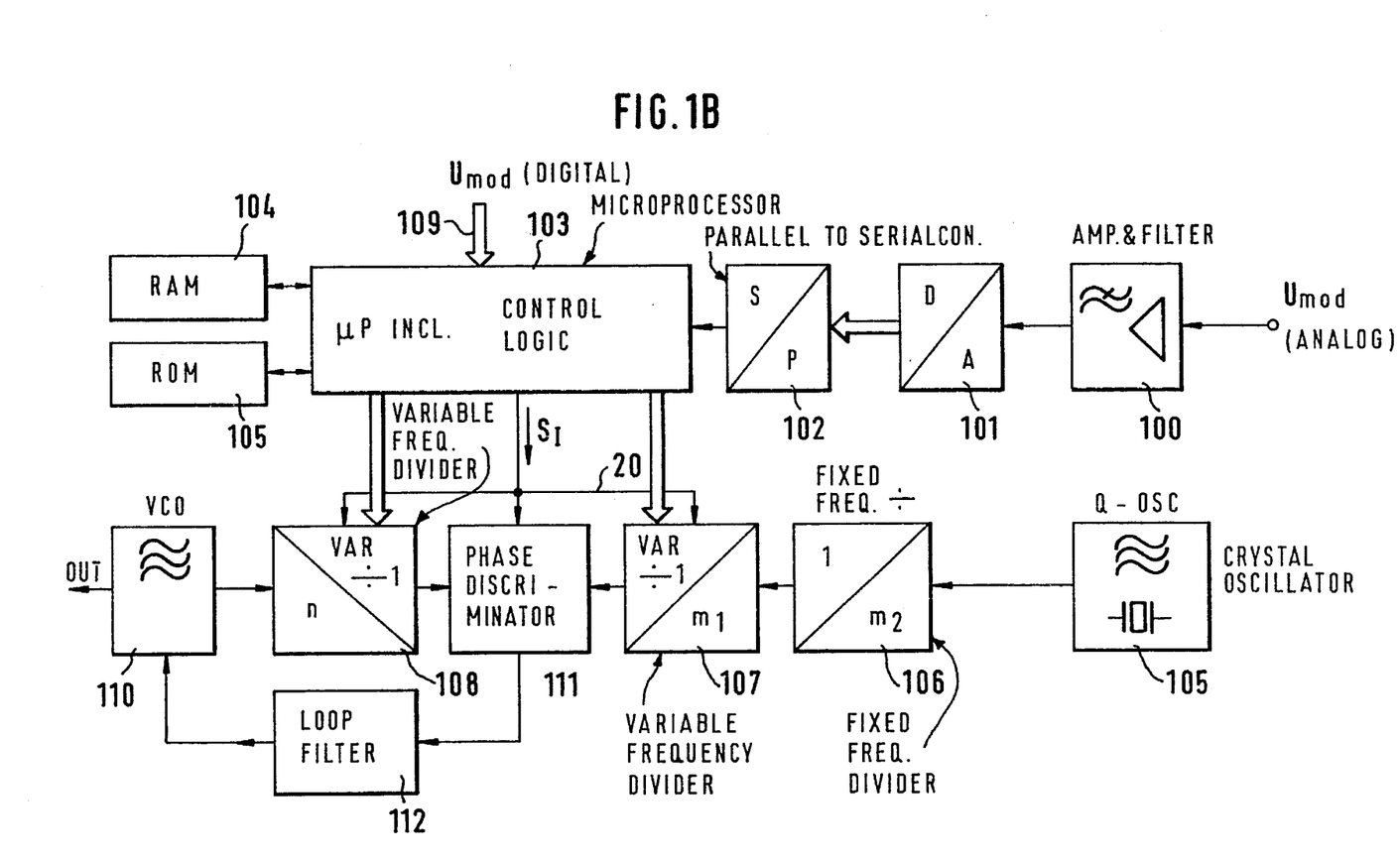
FIG. 1B is a block circuit diagram of a PLL frequency synthesizer according to the invention equipped for GMSK modulation or other PSK modulation as well as FSK modulation.

It is also important that the two variable-ratio digital frequency dividers 13 and 18 and the discriminator 11 should always be initialized together so that operation of the circuit will always start up with these units in defined states as schematically shown in FIGS. 1A and 1B by connection 20.

In an embodiment of the invention for the case of four phase modulation (QPSK) a highly stable variable frequency divider 16 is used in the reference branch of the circuit of FIG. 1A for implementing the necessary phase jumps of $\pm\pi/2$ and $\pm\pi$ normally achieved in the circuit shown in FIG. 2. That frequency divider has an input frequency which is the quadruple of the comparison frequency which is needed by the phase discriminator 11. It is then necessary for that frequency divider to be capable of settings at any of the division ratios of the group $m_1=2$, 3, 4, 5 and 6 and these settings must be made in correct phase at the beginning of a frequency comparison cycle, a requirement that can be met merely by a corresponding frequency divider initializing procedure. The appearance of the corresponding reference frequency transitions occur at $2\pi$ (phase) intervals of the VCO 10 with the normal setting of the division ratio to 4 and thereby exhibiting the stationary case. If the frequency divider, however, is set at 2, 3, 5 or 6, the incident flank appears early or late by $\pi$ or $\pi/2$. Since the PLL then pulls the VCO towards these phase positions, a precise phase modulation with an exactly maintained phase deviation is possible in this way. In order thus to provide a defined phase jump, for example $+\pi/2$, the reference divider 18 for performing the modulation must be set for one cycle of the reference frequency $f_R$ at the divider ratio 5 and after that cycle must immediately be set back to the ratio 4.

Figure 3A:
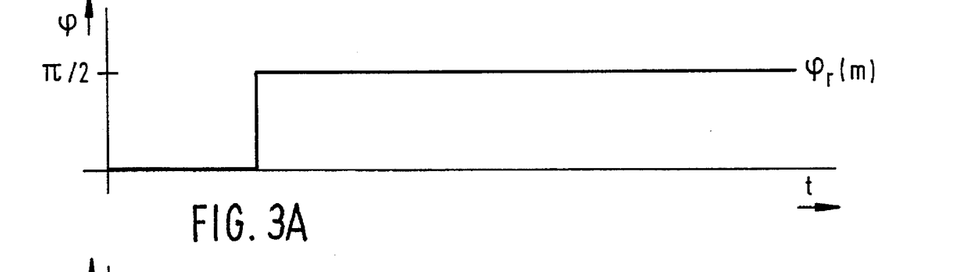
FIG. 3A and 3B are graphs respectively of modulation input and of resulting transitions, the transitions being shown in FIG. 3B for different degrees of damping corresponding to the dynamic properties of the PLL.
Figure 3B:
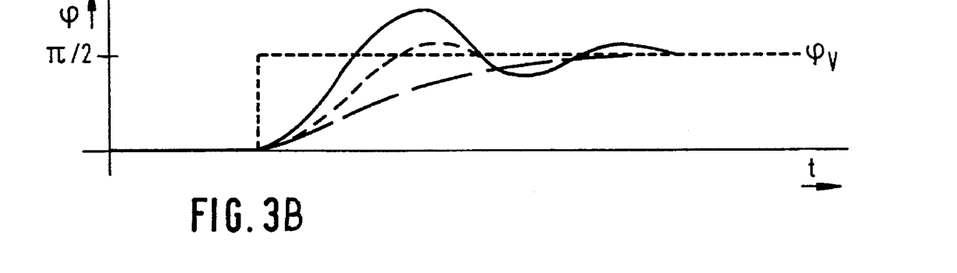

As shown in FIGS. 3A and 3B, in this case there is a sharp phase jump of $\pi/2$ in the comparison frequency and that jump is carried over to the VCO by the PLL.

For this purpose a phase control procedure is inserted which lasts over several periods, at the end of which the VCO has completed the transition to the new phase position at the frequency which has been held constant. The form of this phase transition is prescribed by the loop dynamics. It is determined essentially by the phase steepness of the discriminator 11, the deviation steepness of the VCO 10 control, the properties of the loop filter and the frequency division ratio. The disadvantage of this procedure is that the form of the phase transition cannot be given free choice, a condition which is brought about by certain restrictions relating to the properties of the modulated signal and regarding the modulation bandwidth. Neither an ideally hard phase keying nor an exactly controllable smooth phase transition is therefore possible.

If the main frequency divider has a division ratio of $n \neq 1$, that is to be taken account of in accordance with the equations (1) and (2) above. If it is desired to obtain exactly controlled phase transitions, the desired phase jump of $\Delta\phi$ must be composed of a certain number p of individual steps $\delta\phi_i$:

$$\Delta\phi = \sum_{i}^{1,p} \delta\phi_i \tag{4}$$

Insofar as the partial phase jumps $\delta\phi_i$ of different sizes in the desired manner, are therefore made dependent correspondingly on i, it is possible to obtain any desired depth-profile proximation to the desired ready phase course. The boundary transition formula (5)
and therefore $$\phi(t) = \sum_{1}^{1,n} a_i \cdot \pi h \cdot \int_0^T g(t)dt$$

states the desired transition theoretically to any desired level of accuracy, but it can be implemented if only approximately practice or technology. By suitable choice of the properties of the loop filter it is nevertheless possible for the partial phase jumps (stepwise pattern) to be smoothed enough so that a good approximation to the desired phase course is obtained. A slightly sub-critical jump (step) response (of the filter) should provide the best compromise.

Optimization must be carried out in such a way that the modulation sidebands are reduced far enough so that in the region of interest extending to about $-70$ dB$_c$ the differences between the theoretical and the practical values are negligible.

Figure 4:
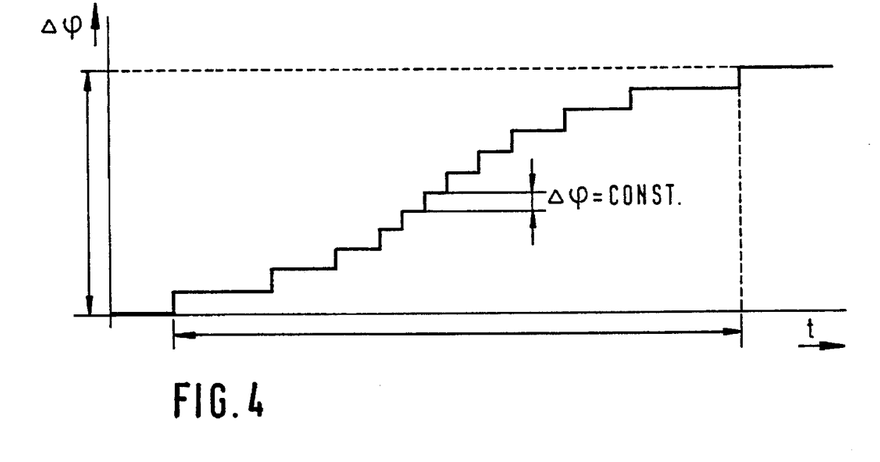
FIGS. 4 and 5 are graphical representations of phase transitions by steps, in accord with the invention, FIG. 4 representing the case of the step height being constant as preferred for GMSK modulation, and FIG. 5 representing the case of the step width (time interval) being constant.
Figure 5:
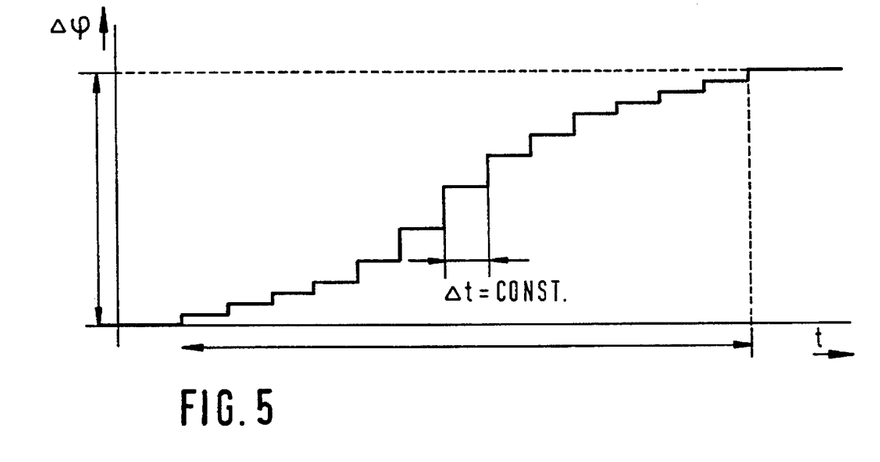

When a phase jump of, for example, $\pi/2$ is to take place in p steps and maximal phase jumps of $\pm\pi$ are to be possible, the adjustable divider must pass through the division ratios of 2 p to 6 p; in some cases the main divider ratio n must be taken account of correspondingly. In order to obtain a desirably good approximation of the stepped curve implementation to the reference curve of the desired phase course, in the case of constant phase steps the time intervals of each step must be suitably varied, as shown in FIG. 4. If, on the other hand, it is desired to have a fixed time pattern or raster, the step width cannot be constant, but must be correspondingly variable, as shown in FIG. 5. In consequence this signifies that the frequency divider input frequency must be greatly increased whereby, among other things, the implementability encounters a limit as the result of approach to the maximal possible frequency division input frequency, as a result of which the use of fixed phase steps and variable time intervals are to be preferred.

Since the circuit of the invention permits modulation (phase or frequency modulation) with constant amplitude, the spectrum of the phase modulation is easily described. As is known the following old for frequency modulation with harmonic signals;

$$s(t) = S_c \cos(\omega_c t + \Delta\phi \sin\omega t) \tag{6}$$

$$S_c = \sqrt{\frac{2E_B}{T}} \tag{7}$$

$$s(t) = S_c \sum_{n}^{-\infty,\infty} J_n(\Delta\phi) \cdot \cos(\omega_c + n\omega)t \tag{8}$$

Anharmonic periodical modulation signals can be represented as Fourier series and thus obtain the following for odd functions, to which consideration should be limited for reasons of simplicity:

$$s(t) = \sin\left\{ \omega_c t + \sum_{i}^{1,m} \Delta\phi_i \sin(i\omega t) \right\} \tag{9}$$

$$s(t) = S_c \sum_{n_i}^{-\infty,\infty} \left[ \prod_{i}^{1,m} J_{ni}(\Delta\phi_i) \right] \cdot \cos\left\{ \omega_c t + \sum_{i}^{1,m} n_i \omega i t \right\} \tag{10}$$

For the correlations here considered it can be assumed that the following approximation is usable:

$$J_i \cdot J_n 1 \text{ für } i \geq 1 \text{ und} \cdot n \geq 1 \tag{11}$$

For the desired sideband spectrum caused by the phase jumps the following result is obtainable:

$$s(t) \approx \sum_{n}^{-\infty,\infty} \sum_{i}^{1,m} J_{ni}(\Delta\phi_i) \cdot \cos(\omega_c + n_i\omega t) \qquad (12)$$

In order to be able to comply with the above mentioned 70 dB$_c$ condition, the partial phase jumps (step heights) must be chosen in accord with equation (12). If there are sufficiently small phase steps, it is possible to disregard even theoretically the provision of any rounding of the phase steps. In practice favorable compromise is likely to be sought.

When the circuit of the invention is incorporated in radio equipment for digital frequency modulation the frequency divider ratio in the frequency synthesizer remains unchanged for as long as the corresponding frequency is to be generated. Both sides from the midfrequency are then possible. If a switchable reference frequency divider is used for producing the modulation, its frequency division ratio becomes inversely proportional to m, since $f_v$ is approximately equal to 1/m. So long as m is much smaller than n, this effect is unimportant. On the other hand, the normally used frequency divider can be used for modulation, in which case this problem disappears, because $f_v$ is approximately equal to n. In order to obtain smooth frequency transitions instead of abrupt transitions, as already mentioned, a suitable dimensioning of the loop filter must be provided and in some cases the frequency shifting back and forth may have to take place by way of many intermediate steps.

As an example of a practical embodiment, the implementation of a digital phase modulator for GMSK, other PSK or FSK modulation will now be further described, with reference to FIG. 1B and FIG. 4, and particularly to GMSK modulation.

It is desirable in this case for the circuit to work with fixed phase steps (jumps) at variable time intervals, for example, in 10° or phase steps, while at the input of the modulation variable frequency divider 107 there is a frequency 36 times the reference frequency unless the divisor of the variable frequency divider 107 is changed to 35 or 37.

The form of a baseband PSK signal is best provided by means of a table stored in a read-only memory (ROM) 105 in which the required changes in frequency division ratio are stored. This requires accurate timing of the steps in order to generate the time interval required between steps in every case. That can be provided by means of a second table in a second ROM. Of course it is possible to combine the two read-only memories into one physical unit. The comparison frequency (in the PLL) must be so chosen that the loop filter on the one hand will satisfactorily suppress sidebands arising from the phase quantization and, on the other hand, that the frequency division remains controllable.

FIG. 1B shows a digital modulator according to the invention for FSK and PSK signals usable for GMSK signals, for example. If the modulating signal is an analog signal, the low frequency modulation voltage $U_{mod}$ is supplied to an amplifier 100 which has a low-pass frequency characteristic. It is then converted to a multibit digital signal with a converter 101 operating at a suitable sampling rate (generated by means not shown in the drawing). If the microprocessor 103 so requires, the samples are then converted into serial binary data by a parallel to serial converter 102. If the modulating signal is digital it can go directly to the input 109 of the microprocessor 103, which is equipped with a random access memory 104 and a read-only memory 105.

A multiple of the reference frequency is generated in the quartz-controlled oscillator 105, just as in the case of FIG. 1A. The output of the quartz-controlled oscillator 105 first goes to a fixed frequency divider 106. This is necessary in order to enable the variable frequency divider 107 which follows it to be controlled over a suitable range of frequency by small changes of the variable division ratio. In the present case, the choice is between a variable division ratio of 1/35, 1/36 and 1/37. The modulation is now explained with reference to QPSK with continuous phase transitions.

The essence of the QPSK modulation system is that, for convenience in demodulating, the phase of the respective logic levels (of a serial digital signal said to be in a frequency "base band") are "orthogonal", which means that a transition from one logic level to the other can be made by a 90° total phase shift.

To produce a total phase shift of 90° with the smoothness required for QPSK modulation it is sufficient to make the phase shift in steps of 10°. Phase shift accuracy is directly related to the magnitude of the constant divisor of the frequency divider 106. In the illustrated case if the fixed frequency divider divides by N the total frequency division between the frequency of the quartz oscillator 105 and the input reference frequency to the phase comparator 111 should be of the order of 1/36N and the variable frequency divider 107 should be able to switch from a division of 1/36 to a division of 1/35 or a division of 1/37. If for one cycle of the reference frequency supplied to the phase comparator (in this example 36 cycles of the oscillator 105) the divider 107 is switched from a divisor 36 to a divisor 35 or 37, the desired phase state in this example occurs 10° earlier or later than if the divisor of the frequency divider 107 had not been changed. The altered state of the reference frequency phase is then maintained by switching back to the 1/36 division in the divider 107 at the end of the single cycle of the reference frequency. Additional steps in the same direction can be provided at the intervals prescribed in the memory 105. As long as the frequency divisor between the frequency of the oscillator 105 and the reference frequency is 36N, the phase will not change. The frequency remains at the carrier frequency. The phase can be shifted 10° in one direction by one cycle of the reference frequency with the divisor 35 and 10° in the other direction by one cycle of the reference frequency with the divisor 37.

Of course if there is only one a transition to an adjacent symbol and a jump back to the previous symbol, a transition in the other direction immediately begins in QPSK modulation. The principle of the timing of the steps of equal phase shift is shown in FIG. 4.

The modulated wave produced at the left-hand output of the controlled oscillator 110 in FIG. 1B may be said to have a "carrier wave" which is the wave which appear when no modulating signal is present. The use of the term "carrier" in this connection does not signify that the wave is of the frequency that is radiated by a transmitter in which the apparatus of FIG. 1B is installed. Phase and frequency modulated waves may easily be raised in frequency by heterodyne frequency conversion before transmission without distortion of the modulation, and likewise down-converted in frequency in a receiver. In the GMSK example, the modulated oscillator could operate at the "baseband" frequency in accordance with the GSM recommendation (published in English) for European mobile radio transmission. The baseband modulated signal can then be raised in frequency to fit a selected or assigned channel in one or more frequency bands by portions of the frequency synthesizer not shown in FIG. 1B.

In frequency modulation, as distinguished from QPSK and other phase modulation, at the end of one transition by phase shift, at least in the case of successive bits of the same logic level, a divisor higher or lower than the unmodulated carrier frequency divisor should remain in use between transition.

If the divisor n of the frequency divider 108 is different from unity (greater than 1), then at the VCO 110 the resulting steps are n-fold multiples of 10° in the example given above. In order to provide steps of 10° in that case the control logic and the microprocessor have to divide the size of the nine single steps by n.

When n is much greater than 1 it is also possible to combine the divisors of the frequency dividers 106 and 107 into a single operation and to carry out the control of phase by means of variation of the divisor n. In that case, however, the reference frequency must be much smaller than $f_{ch}$, which is the channel spacing frequency difference. The more favorable embodiment, therefore, is for n=1 or other small values of n, with control of phase or frequency by means of the variable divisor 107.

It is also important that phase steps are applied, in the preferred embodiments, to the variable frequency divider 107 at the reference frequency side of the phase discriminator 111 and are smoothed by the loop filter 112 before controlling the VCO 110. The reference phase steps and the loop filtering are chosen in such a way that the resulting phase transition of the VCO is a very good approximation to the desired transition, whether for the GMSK system or any other PSK or FSK modulation. The remaining error causes a bandwidth enlargement which is negligible.

The modulating circuit of the present invention can be installed in broadcast or communication equipment as a digital phase modulator or as a digital frequency modulator. It provides controlled phase or frequency transitions simply and economically. The control of the modulator's frequency divider(s) must, however, operate very precisely and the dimensioning of the loop filter of the PLL must be very carefully provided.

Although the invention has been described with reference to particular illustrative examples, it will be recognized that variations and modifications are possible within the inventive concept.

The frequency dividers 106 and 107 could be combined, for example, into a single variable frequency divider (using a single counter, for example) in which the divisor would be changed by steps larger than unity. The use of a fixed frequency divider, as illustrated, however, is more economical.

In the claims the "first" frequency dividing means and the "first" variable-ratio divider refer to the dividing means and to the variable divider first-mentioned in the claim. In this specification it was convenient for explaining the invention by mentioning the other variable frequency divider "first". In the first claim, however, it was necessary to refer to the PLL loop first and that required designating the frequency divider in that loop as "first".

What is claimed is:

1. A method of modulating, in phase or frequency, an electric wave with a binary digital signal while minimizing the bandwidth of the resulting modulated wave, comprising the steps of:

generating (16) an electric oscillation of a stable fixed frequency and furnishing it to a first variable-ratio digital frequency divider (17, 18);

digitally dividing the frequency of said oscillation in a variable-ratio frequency divider and supplying a frequency-divided oscillation as a reference frequency oscillation to a phase discriminator (11);

generating, by means of a voltage-controllable oscillator (10) (VCO), said electric wave, said VCO (10) having a frequency control input;

supplying output oscillation derived from said voltage controllable oscillator (10) to said phase discriminator (11);

comparing in said phase discriminator (11) said oscillation derived from the voltage controllable oscillator (10) and said frequency divided oscillation, serving as reference frequency oscillation, and thereby deriving a comparison signal at an output of said phase discriminator, supplying the comparison signal to said control input of said voltage-controlled oscillator (10) in a loop, introducing modulation signals to one of:
      the generated, stable fixed frequency oscillations, and
      the loop between the voltage controlled oscillator (10) and the phase discriminator, whereby said comparison signal will bring or keep the frequency of said oscillation excited by said wave to the frequency of said divided oscillation serving as a reference frequency oscillation, and whereby at a selected available frequency division ratio of said first variable-ratio frequency divider, said oscillation serving as a reference frequency oscillation maintains undisturbed phase progress at a frequency determined by said selected frequency division ratio of said first variable-ratio frequency divider (17, 18); and producing digitally, in response to said binary digital signal by reference to stored time division data for binary digital transitions, steps of phase shift in a bandwidth-reducing pattern, each said step being produced digitally by a change of the division ratio of said variable-ratio frequency divider (17, 18) at the timing of each said phase shift step, for a period of one cycle of said frequency divided oscillation serving as a reference frequency oscillation, with return to said selected frequency division ratio, after each of said phase shift steps, for maintaining said phase progress at said frequency determined by said selected frequency division ratio between successive phase shift steps and between said transitions of said binary digital signal as modified by said phase shift steps.

2. The method of claim 1 wherein said first variable-ratio digital frequency divider (17, 18) is a cascaded variable-ratio frequency divider composed of a fixed-ratio frequency divider component (17) and a variable-ratio frequency divider component (18) operating in cascade, whereby the over-all variable ratio of said cascaded variable-ratio frequency divider is variable only in divisor change steps greater than unity, and wherein said first variable-ratio frequency divider component (18) of said cascaded variable-ratio frequency divider is used in the method step of digitally producing said steps of phase shifts and provides only minimum (unitary) changes in the divisor of said first variable-ratio frequency divider component (18) of said cascaded variable-ratio frequency divider, and wherein said phase shift steps are all of equal phase shift magnitude.

3. The method of claim 1 wherein said output oscillation excited by said wave has the same frequency as said wave.

4. The method of claim 2 wherein said output oscillation excited by said wave has the same frequency as said wave.

5. The method of claim 1 wherein said frequency divided oscillation is derived from said stable fixed frequency by frequency division in said first variable ratio frequency divider, which includes cascaded digital frequency dividers.

6. The method of claim 2 wherein said frequency divided oscillation is derived from said stable fixed frequency by requital frequency division in cascaded digital frequency dividers.

7. The method of claim 5 wherein said cascaded digital frequency dividers include a variable-ratio frequency divider (18) and a fixed frequency divider (17), and wherein some phase shift steps are magnified in phase shift magnitude by increasing the divisor of said variable-ratio frequency divider (18), under control of additional stored data, for providing a bandwidth reducing pattern of phase-shifts.

8. The method of claim 7 wherein said phase shift steps are at uniform intervals in a transition, and consequently only one interval value needs to be stored;

wherein several division ratios of said variable-ratio frequency divider (18) needed for phase shifts are stored and used to produce a pattern of successive phase shift magnitudes by control of said variable-ratio frequency divider.

9. The method of claim 7 wherein said phase shift steps are at uniform intervals in a transition, and consequently only one interval value needs to be stored;

wherein different numbers of cycles of said frequency divided oscillation serving as a reference frequency are stored and are used for producing phase shift steps of different magnitudes in a bandwidth reducing pattern.

10. The method of claim 1 including the step of initializing, in common, said first variable frequency divider (17,18), said phase discriminator (11), and said output oscillation, derived from said voltage-controllable oscillator (10), supplied to said phase discriminator (11).

11. Frequency and phase modulator for digital modulation and optional transmission of signals, usable in broadcasting communication, comprising a highly stable voltage controlled oscillator (VCO) (16);

a first controllable frequency divider (17, 18) coupled to the output of the VCO (16);

a voltage controllable oscillator (10) providing an output signal at a first output (2) thereof;

a second controllable frequency divider (13) having its input coupled to a second output (3) of the voltage controllable oscillator (10);

a phase discriminator (11) having one input (15) coupled to the output of the first frequency divider (17, 18) and receiving a reference frequency therefrom, said phase discriminator having a second input coupled to the output of the second controllable frequency divider (13);

a loop filter (12) serially connected, in a loop, between an output of the phase discriminator (11) and an input to the voltage controllable oscillator (10);

a common initialization connection (20) for initializing together said first controllable frequency divider (17, 18) said phase discriminator (11), and the second controllable frequency divider (13), and wherein modulation is applied to said modulator, by modulating one of:

the highly stable voltage controlled oscillator VCO (16) and a signal in the loop between the phase discriminator (11) and the input to the voltage controllable oscillator (10).

12. The modulator of claim 11 wherein said loop filter includes a summing circuit (14) forming a means for adding a modulating voltage to the voltage provided by the output of said loop filter (12), to introduce modulation into said loop between the output of the phase discriminator (11) and the input to the voltage controllable oscillator (10).

13. The modulator of claim 11 wherein the first controllable frequency divider (17, 18) comprises two cascaded frequency divider elements (17, 18) in which at least one divider element (17) has a fixed division ratio $m_2$ and the other divider element (18) a variable division ratio ($m_1$).

14. The modulator of claim 13 wherein, for four phase modulations, an input frequency of the first controllable frequency divider (17, 18) is four times the comparison frequency required by the phase discriminator (11);

wherein the first controllable frequency divider has a first divider element and a second divider element;

wherein the division ratio $m_1$ of the first divider element (18) is controllable to be $m_1=2, 3, 4, 5, 6$;

wherein the division ratio $m_2$ of the second divider element (17) is fixed;

wherein a division ratio n of the second frequency divider (13) is defined as n=1; and wherein $m_1$ is selectable in accordance with the values selected, respectively, for n and $m_2$.

15. The modulator of claim 12 wherein the first frequency divider (17, 18) comprises two cascaded frequency divider elements (17, 18) in which one divider element (17) has a fixed division ratio ($m_2$) and the other divider element (18) has a variable division ratio ($m_1$); and wherein the division ratio $m_1$ of the other divider element is controlled to be $m_1=2, 3, 4, 5, 6$, wherein the fixed division ratio $m_2$ of said one divider element (17) is $m_2=1$, and wherein a division ratio (n) of the second frequency divider (13) is n=1.

16. The modulator of claim 11 wherein said highly stable voltage controlled oscillator (16) comprises a crystal oscillator, said crystal oscillator having a controlled input permitting modulation by a frequency lower than a frequency variation limit of said loop;

and further including a signal adding unit (14) connected within said loop between said discriminator (11) and said voltage controllable oscillator (10), said signal adding unit having a input for receiving a modulation frequency greater than said frequency variation limit of said loop.

17. The modulator of claim 11 including read-only memory means to control the time intervals of transition, and the division ratio of said first controllable frequency divider (17, 18) to permit rapid transmission between binary phase shift or frequency shift extremities without excessive bandwidth.

* * * * *